United States Patent [19]

Kerey et al.

[11] Patent Number: 5,089,443
[45] Date of Patent: Feb. 18, 1992

[54] METHOD OF MAKING A SEMICONDUCTOR HEAT SINK

[75] Inventors: Apor Kerey, Marlborough; Peter Delivorias, Peabody, both of Mass.

[73] Assignee: Prime Computer, Inc., Natick, Mass.

[21] Appl. No.: 530,830

[22] Filed: May 30, 1990

[51] Int. Cl.⁵ .................................. H01L 21/461
[52] U.S. Cl. ................................ 437/246; 437/249; 437/902
[58] Field of Search ............... 437/902, 249, 245, 246; 357/81; 250/492.2, 492.24, 492.3

[56] References Cited

U.S. PATENT DOCUMENTS

| | | | |
|---|---|---|---|
| 4,080,722 | 3/1978 | Klatskin et al. | 437/249 |
| 4,567,505 | 1/1986 | Pease et al. | 357/81 |
| 4,783,428 | 11/1988 | Kalfus | 357/81 |
| 4,860,444 | 8/1989 | Herell et al. | 357/81 |

FOREIGN PATENT DOCUMENTS

| | | | |
|---|---|---|---|
| 58-108751 | 6/1983 | Japan | 437/902 |
| 59-75650 | 4/1984 | Japan | 357/81 |
| 60-66452 | 4/1985 | Japan | 357/81 |

Primary Examiner—Olik Chaudhuri
Assistant Examiner—David E. Graybill
Attorney, Agent, or Firm—Wolf, Greenfield & Sacks

[57] ABSTRACT

A method for making a heat sink device as constructed for use with a semiconductor circuit chip 15. On a thermally conductive substrate a layer of a metal alloy is deposited. The metal alloy is thermally conductive and electrically insulative. Cavities are selectively and controllably formed in the alloy layer to define a plurality of heat dissipation members having heat dissipation surfaces.

25 Claims, 2 Drawing Sheets

METHOD OF MAKING A SEMICONDUCTOR HEAT SINK

BACKGROUND OF THE INVENTION

1. Field of the Invention

The present invention relates in general to semiconductor chip cooling devices and the method of fabrication thereof. More particularly, the present invention relates to an improved technique for the fabrication of heat sink semiconductor chip cooling devices. Even more particularly, the invention relates to a method for precisely controlling the topography of heat sink semiconductor chip cooling devices allowing use of a wide range of cooling membranes to interact with these devices while maintaining an optimum arrangement for maximum heat transfer.

2. Background Discussion

With the introduction of very large scale integrated circuits, heat dissipation has become an ever increasing problem. Because of the development of greater density circuit boards, there have been numerous ways developed to carry away excessive heat build up.

One of the basic ways of doing this has been to develop heat sink devices which individually sit on semiconductor chips, and through which heat is dissipated and carried away by a cooling medium.

One of the major problems with these heat sink devices is that the topography of these devices is not accommodating to a wide variety of cooling membranes that rest on top of these devices. Further, some of these devices have not provided an optimum arrangement as far as heat tranfer is concerned, particularly between the device itself and the cooling membrane.

Conventional heat sink chip cooling devices are not fabricatable in a manner to easily provide a desired topography. Thus, any of the following problems could result:

1. the topography may end up rough and could puncture a cooling membrane, particularly one that employs a sack filled with cooling liquid;
2. the resulting topography may not accommodate oddly shaped cooling membranes; and
3. a topography may result which does not include surface structures of maximum surface area and minimum volume which are desired for optimum heat transfer.

Accordingly, it is an object of the present invention to provide a controlled process with which to fabricate a semiconductor chip cooling device.

Another object of the present invention is to provide a controlled process to create a desired topography of the device.

A further object of the present invention is to provide an improved heat sink device for semiconductor devices and in which the device is constructed without any rough or jagged surfaces so that there is no interference with, or puncturing of, any associated cooling membrane.

Another object of the present invention is to provide an improved heat sink device for semiconductor chips that will facilitate the use of a wide variety of cooling membranes. In this regard, the device of the present invention may be constructed in a wide variety of topographies to accommodate the different shapes of cooling membranes.

Still another object of the present invention is to provide an improved heat sink device in accordance with the foregoing objects and which further can be constructed in an array, particularly designed for maximum heat transfer between the heat sink and any cooling membrane that may be employed.

SUMMARY OF THE INVENTION

To accomplish the foregoing and other objects, features and advantages of the invention, there is provided an improved method for the fabrication of heat sink semiconductor chip cooling devices and, in particular, for the controlled setting of creating desired topographies of these devices. The presently disclosed heat-sink device provides for a controlled setting by which the thickness, size, and shape of peaks and valleys of the top alloy layer can be controlled.

In accordance with the method of the present invention, there is provided a method of fabricating a heat sink device adapted for coupling to a semiconductor circuit device for heat transfer therebetween. This method comprises the steps of providing a thermally conductive substrate. In the disclosed embodiment, this is a copper substrate, although other thermally conductive materials may be employed. Next, a metal alloy is selected that is thermally conductive. A layer of this metal alloy is deposited on the substrate to a predetermined thickness. Cavities are selectively and controllably formed in the alloy layer so as to define a plurality of heat dissipation members, having heat dissipation surfaces covering an area greater than the surface area of the substrate covered by these members. A further step in the method of the present invention is one in which the cavities are formed by exposing the alloy layer to a plasma including a gaseous species of a type that is compatible with the material of the alloy layer. The energy level of the gaseous species being applied is readily available under microprocessor control to control the degree of propagation of the gas into the alloy layer. The stoichiometry of the chemical reaction is essentially matched so as to be compatible with the desired degree of etching and the entire process is carried out automatically, preferably under some type of microprocessor control.

Because many different topographies of the heat sink semiconductor chip cooling device can be fabricated, options for cooling membranes to be used therewith are unlimited. A useful configuration for these devices when used on a circuit board would be for each device to separately sit on a circuit chip and together create a module of individual heat sink devices where one cooling membrane, such as one comprised of a sack of liquid coolant, like Freon TM, engages the top of this module.

BRIEF DESCRIPTION OF THE DRAWINGS

The advantages of the invention, as well as the objects, should now become apparent upon reading the following description taken in conjunction with the accompanying drawings, in which.

DETAILED DESCRIPTION

Figure 3:
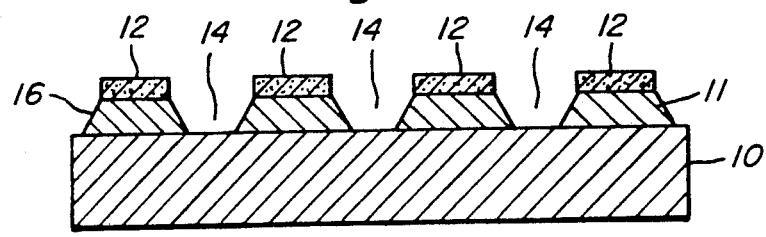
FIG. 3 illustrates the next step in the process, including isotropic etching accomplished in a controlled setting.
Figure 4:
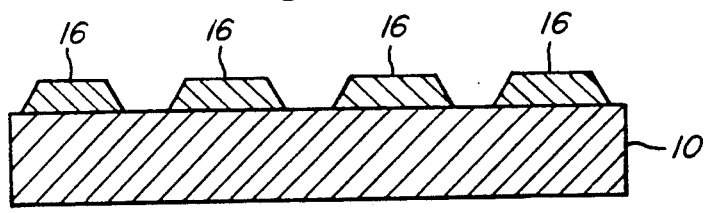
FIG. 4 illustrates a further step which includes the removal of the photoresist and associated oxidation of the substrate.
Figure 5:
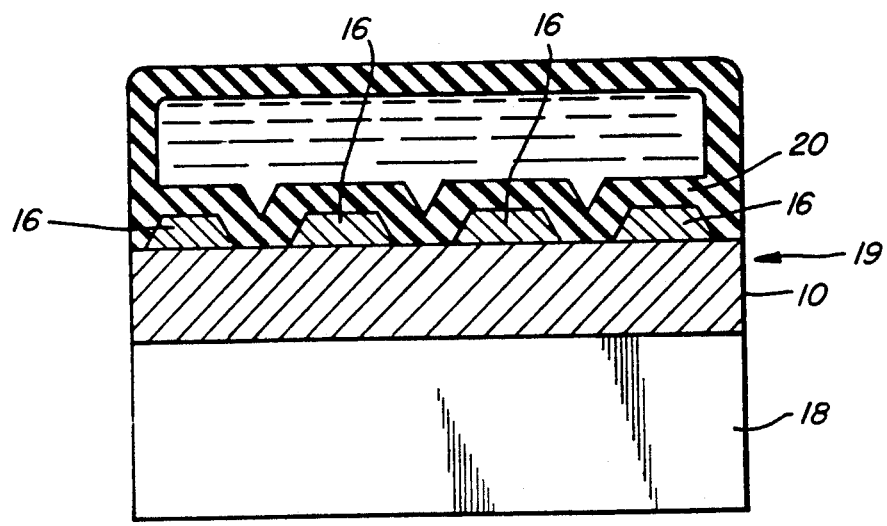
FIG. 5 illustrates the device being used to cool a semiconductor chip while, in this particular embodiment, employing liquid coolant in a sack as the cooling membrane.

Described herein, in FIGS. 1-5, are various steps in the process of fabricating a heat sink, in accordance with the present invention for use with a semiconductor circuit chip. This heat sink device is preferably adapted for use by direct thermally conductive contact with the circuit chip, such as illustrated in FIG. 5 herein, and to be described in further detail hereinafter. This device may be used with other cooling means, such as forced air or, as described herein, may be used in association with a physical cooling device, such as a cooling membrane.

One objective of the present invention is to produce a heat sink device 19 where the topography of the top alloy layer is controlled. This controlled topography is desired so as to be able to accommodate a multiplicity of cooling membranes, to avoid puncturing a cooling membrane that consists of a sack which encloses a liquid coolant, and to achieve a topography which includes an array of, preferably, truncated pentahedral structures which provide for optimum heat transfer. The following discussion describes such a process.

The present invention is a heat sink semiconductor chip cooling device that is used individually on a semiconductor chip but in combination with other such devices can make up a module to which a common cooling membrane, or the like, can be applied.

The heat sink semiconductor chip cooling device can be fabricated through the following process.

Figure 1:
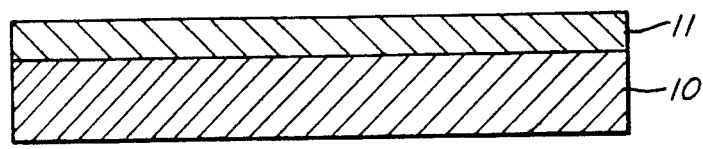
FIG. 1 illustrates an initial step in the process of the present invention using the fabrication of an improved heat sink device and in which an initial layer of a metal alloy is deposited on a thermally conductive substrate.

FIG. 1 shows the first step in the process. FIG. 1 illustrates the substrate 10. Any good thermally conductive material, such as copper, may be used as the substrate. This first step involves the deposition of a layer 11 of copper alloy of refractory metal such as Copper Tungsten (CuW) or Copper molybdenum (CuMo). The material for this layer is not restricted to a copper alloy of refractory metal but to any material with the desired stoichiometry to react with the gas applied during the etching process as to be subsequently described. The thickness of this layer should be predetermined depending on the type of cooling membrane being used and the corresponding desired topography. This layer may be deposited by a sputtering technique or through an e-beam evaporation technique. This layer 11 is a thermally conductive layer.

Figure 2:
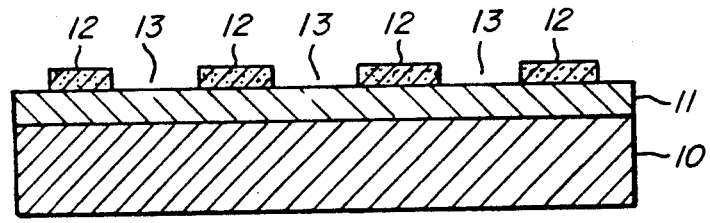
FIG. 2 illustrates a next step in the process, including the formation of windows in the alloy layer.

FIG. 2 shows the next step in the process which involves deposition of a layer of photo resist on the alloy layer and subsequent etching of portions of the photoresist layer to form layer segments 12 as illustrates in FIG. 2. This etching is accomplished by means of a conventional photolithographic technique leaving window areas at 13. The remaining segments 12 of the photoresist layer that have not been removed form a mask for subsequent etching, as to be illustrated in FIG. 3.

The next step of the process as illustrated in FIG. 3 involves isotropic etching. This particular form of etching is preferred, in comparison to anisotropic etching, so as to provide a controlled form of etching as illustrated in FIG. 3. This provides the desired tapered cavities as indicated at 14 in FIG. 3. This process includes subjecting the device to a plasma environment containing a gaseous species such as chlorofluoride (CF4) that will react with the alloy layer. The plasma removes the refractory metal by etching, leaving the desired etched cavities 14 in the alloy layer. The energy level of the gas being applied is varied to change the degree of propogation into the alloy layer to achieve the desired result. The stoichiometry of the chemical reaction is figured out beforehand as well as the desired degree of etching and the process is automated under microprocessor control.

The desired topography includes an array of truncated pentahedral copper alloy structures (heat dissipation members 16). The physical properties of a truncated pentahedron, which include a maximum ratio of surface area to enclosed volume, produce optimum heat transfer characteristics. Upon detection of the final stage of refractory metal removal, the gas is then shut off and oxygen is introduced to the reactive system. In actual practice, this plasma technique is carried out in a plasma chamber, in which the proper plasma gasses introduced are followed by the evacuation of that gas and introduction of oxygen, as previously noted.

FIG. 4 identifies the next step in the process. This step includes the introductgion of oxygen to the structure. The oxygen has a dual function. The oxygen serves to remove the photoresist (larger segments 12) and simultaneously oxidizes the exposed copper surface of the substrate. The removal of the photoresist is controlled by the level of oxygen introduced while the oxidation of the substrate is incidental to this process. Due to the oxidation, an electrically insulating layer of oxidized micro-copper crystals is formed on the etched side of the structure, both on the exposed surface of the substrate 14 and surface of the heat dissipation members 16. The resulting structure is a heat sink device that is both thermally conductive and electrically insulated.

Figure 6:
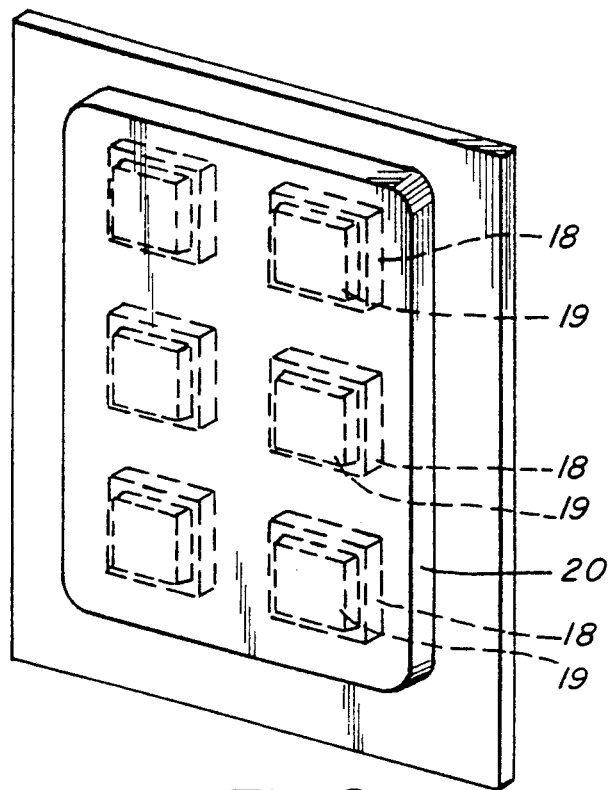
FIG. 6 is a diagram illustrating the device of the present invention as in use on a circuit board employing multiple circuit chips.

The resulting structure can be used for heat removal from a semiconductor chip used on a circuit board. As illustrated in FIG. 5, the structure, with substrate side down, is directly attached to a semiconductor chip 18. A cooling membrane 20 is placed on top of the alloy portion of the structure. Because the topography of the alloy portion of the structure can be controlled by using the previously described procedure, many different shapes and sizes of cooling membranes can be employed. One such cooling membrane, shown in FIG. 5 includes a sack which encloses a liquid coolant such as Freon TM or fluorocarbon. When used on a circuit board, multiple heat sink devices may be used on different chips and a common cooling membrane may be applied to the top of all of the devices, as illustrated in FIG. 6. Alternatively, conduction or convection may be used to accomplish the cooling whereby cool air would be piped in to the top surface of all of the chip cooling devices.

Figure 7:
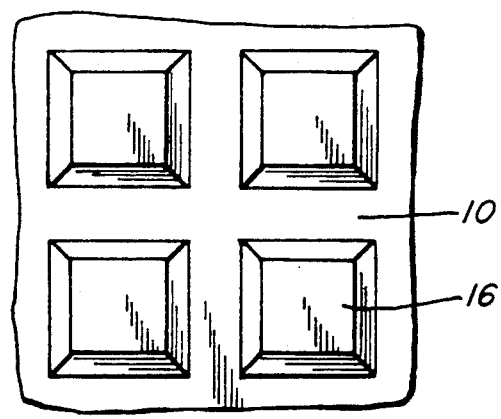
FIG. 7 is a fragmentary plan view of the heat sink device, such as illustrated in FIG. 4, and illustrating in further detail the configuration of the heat dissipation members.

Reference is also now made to FIG. 7, which is a fragmentary plan view showing further details of one particular construction for the heat sink. FIG. 7, in particular, shows the heat dissipation members 16 being of truncated pyramid shape. The spacing between these individual members 16 may be relatively close so that there is a relatively small gap therebetween. This is preferred so that as many of these members as possible per square area can be disposed.

Having now described the limited number of embodiments of the present invention, it should now be apparent to those skilled in the art that numerous other embodiments and modifications thereof are contemplated as falling within the scope of the present invention as defined by the appended claims.

What is claimed is:

1. A method of fabricating a heat sink device adapted for coupling to a semiconductor circuit device for heat transfer therefrom, said method comprising the steps of:
providing a thermally conductive substrate,
selecting a metal alloy that is thermally conductive,
depositing a layer of said metal alloy on said substrate, and to a selected thickness, said thickness selected with regard to the ultimate heat sink topography desired,
selectively and controllably forming cavities in said alloy layer defining a plurality of heat dissipation members having heat dissipation surfaces covering an area greater than the surface area of the substrate covered by said members, and
oxidizing the resulting exposed substrate and heat dissipation members thereby forming an electrically insulating surface layer on said exposed substrate and heat dissipation members.

2. A method as set forth in claim 1, wherein the step of forming the cavities includes etching the alloy layer until the substrate is exposed.

3. A method as set forth in claim 2, including applying a photoresist layer over the alloy layer, removing the portions of the photoresist layer only in areas where the cavities are to be formed, and subsequently etching the alloy layer to form said cavities.

4. A method as set forth in claim 3, wherein the remaining photoresist layer is then removed by said oxidation.

5. A method as set forth in claim 1, wherein the step of forming cavities includes depositing a mask layer on said layer of metal alloy, defining windows in the mask layer corresponding to the desired alloy layer topography, and etching the alloy layer to form this topography.

6. A method as set forth in claim 5, wherein the step of etching to form said topography includes forming the alloy layer topography to substantially mate with a topography of a cooling membrane.

7. A method as set forth in claim 6, wherein the heat dissipation members are comprised of an array of truncated pentahedrons for enabling maximum heat dissipation.

8. A method as set forth in claim 5, wherein the etching step used to form the cavities is isotropic.

9. A method as set forth in claim 8, wherein the isotropic etching is performed by exposing the device to a plasma environment containing a gaseous species which reacts with the alloy layer so as to etch said alloy layer.

10. A method as set forth in claim 9, wherein the energy level of the gas applied is varied during application, thereby controlling the degree of said etching into the alloy layer.

11. A method as set forth in claim 10, wherein the gas applied is chlorofluoride (CF4).

12. A method as set forth in claim 5, including removing the mask layer after the cavities are formed.

13. A method as set forth in claim 5, wherein said oxidizing includes applying oxygen to the device to remove the mask layer and to introduce an oxide layer on the thermally conductive substrate and the etched layer of metal alloy thereby causing said thermally conductive substrate and said etched layer to become electrically insulated.

14. A method as set forth in claim 1, wherein said alloy layer is deposited using a chemical e-beam evaporation technique.

15. A method as set forth in claim 1, wherein said alloy layer is deposited by sputtering.

16. A method as set forth in claim 1, wherein said step of forming the cavities includes exposing the alloy layer to plasma including a gaseous species of a type which reacts with the material forming the alloy layer to etch such material.

17. A method of fabricating a heat sink device adapted for coupling to a semiconductor circuit device for heat transfer therefrom, said method comprising the steps of:
providing a thermally conductive substrate,
selecting a metal alloy that is thermally conductive,
depositing a layer of said metal alloy on said substrate, and to a selected thickness, said thickness selected with regard to the ultimate heat sink topography desired,
selectively and controllably forming cavities in said alloy layer defining a plurality of heat dissipation members having heat dissipation surfaces covering an area greater than the surface area of the substrate covered by said members,
wherein the step of forming cavities includes depositing a mask layer on said layer of metal alloy, defining windows in the mask layer corresponding to the desired alloy layer topography, and etching the alloy layer to form this topography,
wherein the step of etching to form said topography includes forming the alloy layer topography to substantially mate with the topography of a cooling membrane,
wherein the heat dissipation members are comprised of an array of truncated polyhedrons for enabling maximum heat dissipation.

18. A method as set forth in claim 17, wherein said truncated polyhedrons are truncated pentahedrons.

19. A method of fabricating a heat sink device adapted for coupling to a semiconductor circuit device for heat transfer therefrom, said method comprising the steps of:
providing a thermally conductive substrate,
selecting a metal alloy that is thermally conductive,
depositing a layer of said metal alloy on said substrate, and to a selected thickness, said thickness selected with regard to the ultimate heat sink topography desired,
selectively and controllably forming cavities in said alloy layer defining a plurality of heat dissipation members having heat dissipation surfaces covering an area greater than the surface area of the substrate covered by said members,
wherein the step of forming cavities includes depositing a mask layer on said layer of metal alloy, defining windows in the mask layer corresponding to the desired alloy layer topography, and etching the alloy layer to form this topography, wherein the etching step used to form the cavities is isotropic, wherein the isotropic etching is performed by exposing the device to a plasma environment containing a gaseous species which reacts with the alloy layer so as to etch said alloy layer.

20. A method as set forth in claim 19, wherein the energy level of the gas applied is varied during application, thereby controlling the degree of said etching into the alloy layer.

21. A method as set forth in claim 20, wherein the gas applied is chlorofluoride (CF4).

22. A method as set forth in claim 19, wherein the heat dissipation members are comprised of an array of truncated polyhedrons for enabling maximum heat dissipation.

23. A method as set forth in claim 22 wherein the truncated polyhedrons are truncated pentahedrons.

24. A method of fabricating a heat sink device adapted for coupling to a semiconductor circuit device for heat transfer therefrom, said method comprising the steps of:

providing a thermally conductive substrate, selecting a metal alloy that is thermally conductive, depositing a layer of said metal alloy on said substrate, and to a selected thickness, said thickness selected with regard to the ultimate heat sink topography desired, selectively and controllably forming cavities in said alloy layer defining a plurality of heat dissipation members having heat dissipation surfaces covering an area greater than the surface area of the substrate covered by said members, wherein the step of forming cavities includes depositing a mask layer on said layer of metal alloy, defining windows in the mask layer corresponding to the desired alloy layer topography, etching the alloy layer to form this topography, and applying oxygen to the device to remove the mask layer.

25. A method of fabricating a heat sink device adapted for coupling to a semiconductor circuit device for heat transfer therefrom, said method comprising the steps of:

providing a thermally conductive substrate, selecting a metal alloy that is thermally conductive, depositing a layer of said metal alloy on said substrate, and to a selected thickness, said thickness selected with regard to the ultimate heat sink topography desired, selectively and controllably forming cavities in said alloy layer defining a plurality of heat dissipation members having heat dissipation surfaces covering an area greater than the surface area of the substrate covered by said members, wherein said alloy layer is deposited using a chemical e-beam evaporation technique.

* * * * *